US009024637B2

(12) United States Patent
Peter et al.

(10) Patent No.: US 9,024,637 B2
(45) Date of Patent: May 5, 2015

(54) MODULAR MULTI-CHANNEL COIL ARRAY FOR AN MRI HAVING DECOUPLING OF NEXT BUT ONE NEIGHBORS

(75) Inventors: Andreas Peter, Emmendingen (DE); Stefan Schonhardt, Freiburg (DE); Jan Korvink, Karlsruhe (DE)

(73) Assignee: Albert-Ludwigs-Universitaet Freiburg, Freiburg (DE)

( * ) Notice: Subject to any disclaimer, the term of this patent is extended or adjusted under 35 U.S.C. 154(b) by 554 days.

(21) Appl. No.: 13/508,044

(22) PCT Filed: Nov. 5, 2010

(86) PCT No.: PCT/EP2010/066893
§ 371 (c)(1),
(2), (4) Date: May 4, 2012

(87) PCT Pub. No.: WO2011/054923
PCT Pub. Date: May 12, 2011

(65) Prior Publication Data
US 2012/0268133 A1  Oct. 25, 2012

(30) Foreign Application Priority Data
Nov. 6, 2009  (DE) .......................... 10 2009 046 492

(51) Int. Cl.
*G01V 3/00* (2006.01)
*G01R 33/3415* (2006.01)
*G01R 33/34* (2006.01)
*G01R 33/36* (2006.01)

(52) U.S. Cl.
CPC ...... *G01R 33/3415* (2013.01); *G01R 33/34007* (2013.01); *G01R 33/365* (2013.01)

(58) Field of Classification Search
USPC ........................... 324/300–322; 600/410–435
See application file for complete search history.

(56) References Cited

U.S. PATENT DOCUMENTS

| 4,825,162 | A | 4/1989 | Roemer | |
| 6,084,411 | A | 7/2000 | Giaquinto | |
| 6,534,983 | B1 | 3/2003 | Boskamp | |
| 6,900,637 | B1 * | 5/2005 | Seeber | 324/318 |
| 7,282,915 | B2 * | 10/2007 | Giaquinto et al. | 324/318 |
| 7,417,431 | B2 * | 8/2008 | Lanz et al. | 324/318 |
| 7,511,497 | B2 * | 3/2009 | Wosik et al. | 324/318 |
| 7,663,367 | B2 * | 2/2010 | Wiggins | 324/318 |
| 8,581,588 | B2 * | 11/2013 | Driesel et al. | 324/322 |

(Continued)

FOREIGN PATENT DOCUMENTS

| EP | 1 521 094 | 4/2005 |
| WO | WO 2005/076029 | 8/2005 |
| WO | WO 2008/078239 | 7/2008 |

*Primary Examiner* — Dixomara Vargas
(74) *Attorney, Agent, or Firm* — Paul Vincent

(57) ABSTRACT

A mufti-channel coil array for use as a transceiver in magnetic resonance imaging (MRI) has a plurality of radio frequency (RF) coils disposed next to one another, devices for electromagnetically decoupling the RF coils and coil elements which are applied onto a planar carrier element (5). The carrier elements (5) have a regular, equilateral polygonal outer contour and the shape of the individual coils (2) corresponds to the outer contour of the carrier element (5). An individual coil (2) has a loop-shaped structure (1), which leads to a decoupling of individual coils (2) not immediately adjacent to each other when a plurality of individual elements are arranged. The space requirement for adding new coils is reduced, and the modular design makes it possible to easily implement any three-dimensional or two-dimensional shape.

16 Claims, 3 Drawing Sheets

(56) References Cited

U.S. PATENT DOCUMENTS

| | | |
|---|---|---|
| 2004/0124840 A1 | 7/2004 | Reykowski |
| 2005/0253582 A1 | 11/2005 | Giaquinto |
| 2007/0282194 A1 | 12/2007 | Wiggins |
| 2008/0007250 A1 | 1/2008 | Wiggins |
| 2008/0231278 A1 | 9/2008 | Ishihara |
| 2009/0243612 A1 | 10/2009 | Zhu |

* cited by examiner

| Coupling | Coil 1 | Coil 2 | Coil 3 | Coil 4 | Coil 5 | Coil 6 | Coil 7 |
|---|---|---|---|---|---|---|---|
| Coil 1 | - | -25,0 dB | -34,5 dB | -20,5 dB | -27,7 dB | -26,0 dB | -24,7 dB |
| Coil 2 |  | - | -24,5 dB | -30,4 dB | -20,0 dB | -31,0 dB | -25,7 dB |
| Coil 3 |  |  | - | -25,8 dB | -31,6 dB | -20,0 dB | -25,0 dB |
| Coil 4 |  |  |  | - | -26,2 dB | -31,0 dB | -28,0 dB |
| Coil 5 |  |  |  |  | - | -24,9 dB | -24,4 dB |
| Coil 6 |  |  |  |  |  | - | -30,1 dB |
| Coil 7 |  |  |  |  |  |  | - |

Decoupling through overlap

Decoupling through loop-shaped structure

No additional decoupling

MODULAR MULTI-CHANNEL COIL ARRAY FOR AN MRI HAVING DECOUPLING OF NEXT BUT ONE NEIGHBORS

This application is the national stage of PCT/EP2010/066893 filed on Nov. 5, 2010 and also claims Paris Convention priority of DE 10 2009 046 492.1 filed on Nov. 6, 2009.

The invention relates to a multi-channel coil array for use as a transmitting and/or receiving element in magnetic resonance tomography (MRT), comprising a plurality of radio frequency (RF) coils disposed next to one another, wherein devices for electromagnetically decoupling the RF coils are provided, wherein coil elements are mounted to a planar carrier element, which each form an individual element together with the carrier element, wherein the carrier elements have a regular equilateral polygonal outer contour and wherein a 2-dimensional or 3-dimensional structure of the entire coil array is created by joining a plurality of individual elements to each other, wherein the coil elements are arranged on each carrier element such that they result in a complete individual coil (2), respectively, and wherein the individual coils (2) have a shape that corresponds to the outer contour of the carrier element (5).

A device of this type is disclosed in WO 2008/078239.

The signal-to-noise ratio can be considerably improved by using a large number of receiving coils in magnetic resonance tomography (MRT), which, at the same time improves the resolution and also considerably reduces the time for detecting the measured values. Electromagnetic couplings between the individual coils must thereby be largely minimized through suitable measures. This is normally realized by specific overlapping of neighboring coil elements, by amplifiers with high input reflection coefficients, transformers, suitable capacitances between the coils and combinations of these possibilities.

U.S. Pat. No. 4,825,162 describes a device in which several square coils are joined through overlapping and the use of preamplifiers to form an array such that interaction between coils that are not mounted directly next to each other is minimized. This device, however, is not suited for realizing three-dimensional structures.

In U.S. Pat. No. 6,084,411 and US 2008/0007250 A1, a plurality of circular coils are decoupled by overlapping and joined to form a three-dimensional structure.

In US 2008/0007250 A1, the circular coils are mounted to carrier elements having different outer contours, wherein each carrier element only bears partial elements of a coil. This is disadvantageous in that a plurality of carrier elements are necessary for adding one coil, the carrier elements each comprising further coil elements that are not required. In this device, decoupling of the individual coils is moreover sensitive to displacements, for which reason they are not suited for mounting to flexible carrier elements.

EP 1 521 094 A1 presents rectangular coil elements that can be joined to form an array.

In comparison therewith, the coils of US 2005/0253582 have flattened ends.

WO2005/076029 A1 presents round and hexagonal coil elements that can be assembled to form a flat surface.

In the conventional mufti-channel coil arrays, the individual coils are initially roughly geometrically oriented relative to one another and electrically manually successively decoupled from each other through slight modifications of the individual coil shapes. This process is extremely tedious and therefore expensive for the mufti-channel coil arrays published up to now, of which some have more than 128 individual coils. The individual coils must be matched again for each new geometry, which considerably aggravates commercialization.

In this connection, WO 2008/078239 A1 presents square coil elements that can be assembled to form an array and have components by means of which directly neighboring elements can be capacitively and inductively decoupled.

In contrast thereto, it is the underlying purpose of the present invention to modify a mufti-channel coil array of the described type in the technically simplest way possible such that tedious and expensive matching among the coils can be omitted and as many coil elements as possible are decoupled from each other. The space required for adding new coils should additionally be reduced. Any 3-dimensional or 2-dimensional shape can be easily realized through modular construction.

SUMMARY OF THE INVENTION

This object is achieved by the invention in a surprisingly simple but effective fashion in that an individual coil has a loop-shaped structure which, when several individual elements are arranged, results in decoupling of not directly neighboring individual coils.

The inventive device does not require a new design for each new geometry. Further coil elements can be easily added, which requires only one individual element in each case. In contrast to prior art, a 2-dimensional or 3-dimensional structure designed from inventive individual elements does not have any unnecessary coil elements. The loop-shaped structure minimizes any disturbing influence from not directly neighboring individual coils.

Tessellation in $R^2$ (2-dimensional vector space) with coils in an array can also be interpreted as a 2D graph. The nodes of the graph are points at which the edges are connected; the surfaces also meet at one point. The valence of a point is the number of the meeting surfaces or edges. The present invention can decouple all next but one neighboring coils when the valence of the nodes in any graph is exactly three. This condition is met in the plane by hexagonals, but not by division into squares or triangles. This condition is met on a surface in $R^2$ or on a sphere (or another closed shape) by a plurality of tessellation patterns. The Euler formula determines the relation between the edges and the surfaces of tessellation when the valence of the nodes is fixed. On a sphere, a truncated pyramid is the simplest object that satisfies this rule. A cube also meets this condition. The "soccer-ball" element or truncated icosahedron also satisfy this rule. In consequence thereof, all coil array topologies that meet this requirement can be decoupled by the present invention (neighbors and next but one neighbor). A coil array that does not meet this condition (such as e.g. an array of rectangles) cannot be decoupled by the invention since the valence of the nodes is larger than three and for this reason only directly neighboring elements are decoupled.

In one particularly preferred embodiment of an inventive multi-channel coil array, the carrier elements and individual coils have a hexagonal shape, which enables particularly tight covering of 2-dimensional structures.

In one further embodiment of an inventive mufti-channel coil array, the carrier elements and individual coils have a pentagonal shape. This is particularly advantageous in combination with the hexagonal carrier elements and individual coils in order to obtain three-dimensional structures, such as e.g. spheres.

Further embodiments of an inventive multi-channel coil array have carrier elements and individual coils with triangular or square shapes. This is advantageous in order to form further 2-dimensional or 3-dimensional shapes such as e.g. pyramids or cubes.

One particularly advantageous embodiment of the inventive multi-channel coil array is characterized in that individual coil elements of neighboring coils overlap, which minimizes the mutual influence of neighboring coils.

In one particularly preferred embodiment of the invention, all individual elements of the inventive mufti-channel coil array, the carrier elements of which have the same outer contour, are identically constructed. This facilitates handling and production and therefore also considerably reduces the costs.

In one particularly advantageous embodiment of the inventive multi-channel coil array, each carrier element and each individual coil are mechanically designed, in particular by holes for screws, cams or locating pins, in such a fashion that the individual elements can be assembled in a non-positive and positive fashion with minimum expense, in particular using the screws, cams or locating pins, thereby generating an arrangement of any size, in which all neighboring individual elements and, if necessary, all not directly neighboring individual elements are automatically decoupled. This advantageous construction allows adjustment of the multi-channel coil array to any requirement, wherein this adjustment can also be performed by untrained staff after brief instruction.

In one further development of this embodiment, the angles of the individual coils can be fixed relative to one another by means of the screws, cams or locating pins. In contrast to prior art, the angles of the individual coils thereby remain constant with respect to one another even when the array is bent.

In further preferred embodiments of the inventive multi-channel coil array, the carrier elements have openings through which the additional capacitors and transformers can be connected to the individual coils.

Carrier elements of an inventive multi-channel coil array may advantageously be produced from rigid or flexible base material. This enables either production of a stable rigid structure or optionally mounting to curved surfaces. In the field, in which systems of this type are normally applied, the flexible embodiment turns out to be particularly advantageous, since it can be adjusted to any body part. Moreover, the flexible design also permits integration of the system into clothes or cloths or folding using Origami folding techniques for producing particular structures.

In one further preferred embodiment of the inventive mufti-channel coil array, each individual element has a matching circuit for adjusting one or more resonance frequencies and/or performing impedance transformations. This facilitates matching of the coils with respect to one another and minimizes interfering interactions among the coils.

This matching circuit may either be designed to be passive or active and can be arranged either directly on the individual coil or separate from the individual coil in various embodiment variants. Depending on the requirements of the application, this yields great flexibility with respect to effort and space requirements.

In one further embodiment of the inventive multi-channel coil array, at least one individual coil overlaps with all direct neighbors, wherein at the same time additional loop-shaped structures are provided, which decouple not directly neighboring individual coils. Any surface can be covered in a simple fashion by repeatedly joining base surfaces that are structured in this fashion.

The invention also relates to a method for producing an inventive multi-channel coil array, in which the optimum overlapping between the individual coils and the shape of the loop-shaped structure is numerically determined, wherein the size of the loop-shaped structure depends on the edge length of the individual coil. Since the modular approach uses identical coil shapes, the optimum overlapping surface of the individual coils can be numerically calculated. Locating pins guarantee correct orientation of the individual coils with respect to one another. In previous approaches, the coils are initially roughly applied and serially decoupled from one another by bending the coil shape.

In one variant of the inventive method, a virtual model having the geometrical dimensions of an individual coil is generated for numerical optimization, and several of these virtual individual coils are assembled to form a minimum mufti-channel coil array. This minimizes the calculation effort for calculating the optimum overlapping.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 3 shows a table of the coupling values of the individual elements of FIG. 1.

DESCRIPTION OF THE PREFERRED EMBODIMENT

Figure 1:
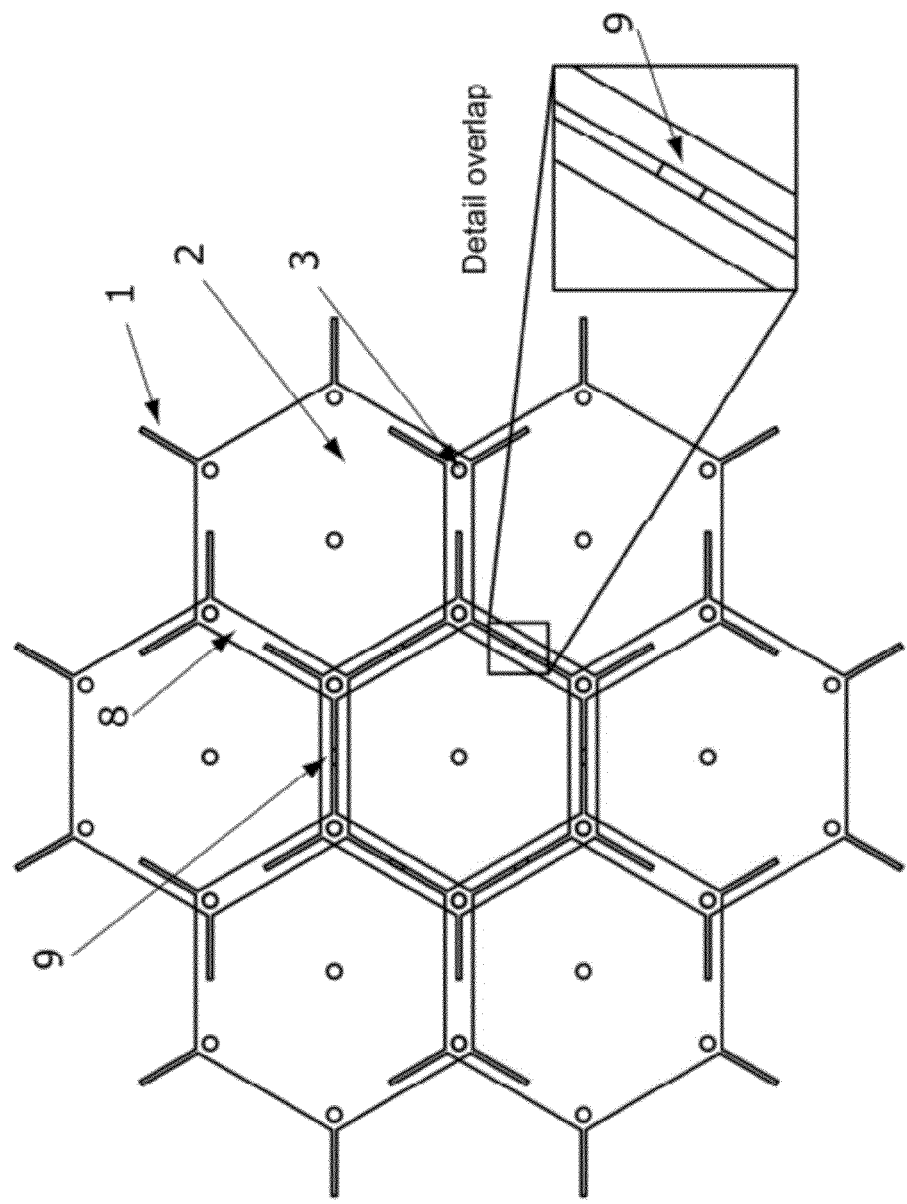
FIG. 1 shows a schematic top view from above of an inventive multi-channel coil array with seven hexagonal overlapping individual elements and loops for decoupling next but one elements.

FIG. 1 shows a mufti-channel coil array that is assembled from 7 individual coils 2. Each individual coil 2 has an overlapping nose 1 containing a loop-shaped structure by means of which not directly neighboring individual coils can be decoupled from each other. Each individual coil additionally has a hole 3 for a locating pin, cam or a screw 4 (see FIG. 2).

The individual coils 2 are constructed in such a fashion that, upon joining several individual coils, neighboring individual coils 2 form an overlapping surface 8 through which the overlapping individual coils 2 are decoupled from each other.

For not directly neighboring individual coils 2, the overlapping noses 1 form a further overlapping surface 9. The loop-shaped structure provided in the overlapping noses decouples the not directly neighboring individual coils 2.

Figure 2:
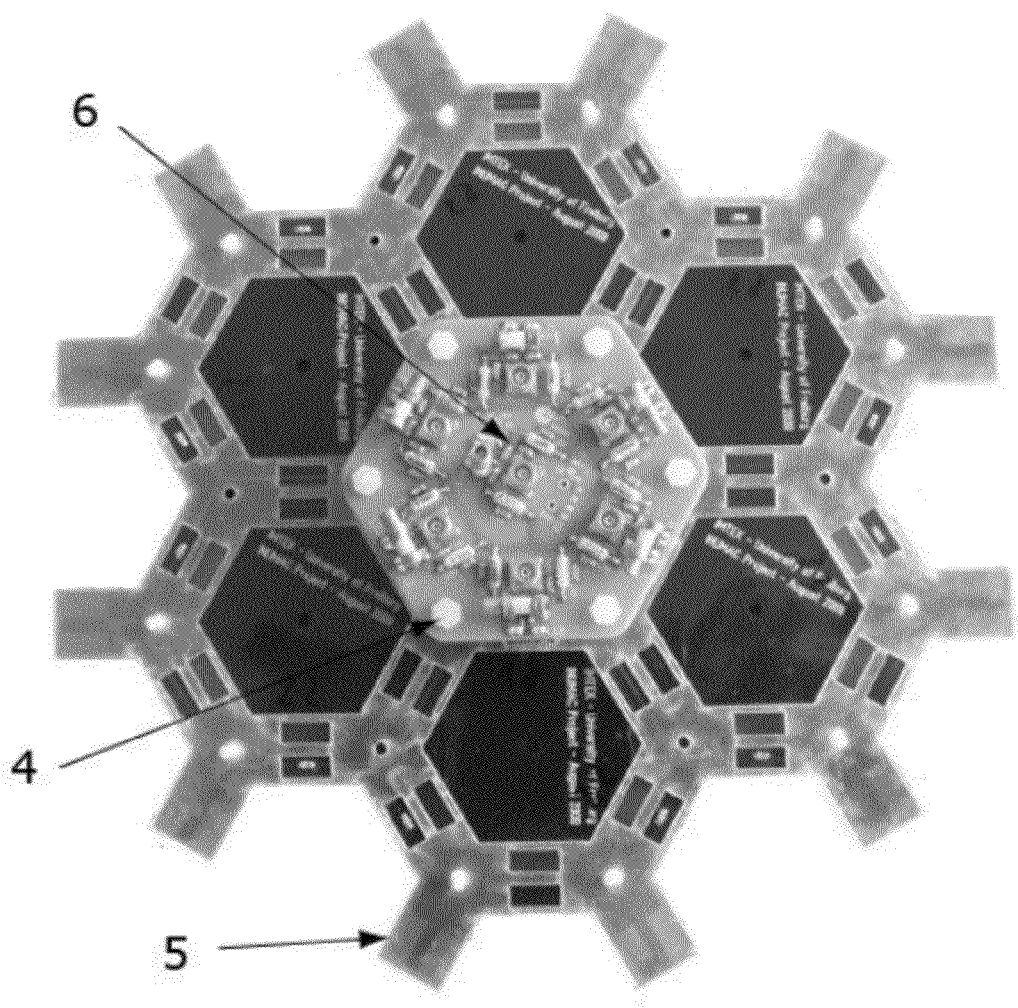
FIG. 2 shows a photo of an inventive multi-channel coil array of seven hexagonal individual elements with overlapping and loops for decoupling next but one elements and a printed circuit board with matching circuit.

In the photograph of FIG. 2, the multi-channel coil array of FIG. 1 is mounted to a flexible carrier material 5. Above the center individual coil, a so-called FR4 printed circuit board is mounted, on which matching and adjustment circuits 6 are arranged. The carrier material 5 has openings 7 through which the capacitors and transformers can be connected to the individual coils 2.

The multi-channel coil array illustrated in FIG. 2 was used to perform measurements for decoupling the coils in the array. The measured values are illustrated in the table in FIG. 3. Smaller values thereby indicate better decoupling. Better decoupling means less disturbing influence from neighboring coils. Coil arrays with values above −20 dB are considered to be poorly decoupled in practice and would cause clear interfering signals in MRT measurements.

LIST OF REFERENCE NUMERALS 1 overlapping nose with loop-shaped structure
2 individual coil
3 hole for locating pin, cam or screw
4 nylon screw
5 carrier element
6 FR4 printed circuit board with matching and adjustment circuit
7 openings for mounting capacitors
8 overlapping surface of the individual coils
9 overlapping surface of the overlapping noses

We claim:

1. A mufti-channel coil array for use as a transmitting and/or receiving element in magnetic resonance tomography (MRT), the array having a plurality of radio frequency (RF) coils disposed next to one another and devices for electromagnetically decoupling the RF coils, the array comprising:
a plurality of individual, planar carrier elements, each carrier element having a regular equilateral polygonal outer contour, wherein a 2-dimensional or 3-dimensional structure of an overall coil array is created by joining said individual carrier elements to each other; and
a plurality of coil elements, each coil element mounted to one carrier element to form a complete, individual coil, each individual coil thereby having a shape that corresponds to an outer contour of said carrier element, wherein said individual coil has a loop-shaped structure decoupling carrier elements which do not directly neighbor each other within the mufti-channel coil array.

2. The mufti-channel coil array of claim 1, wherein said carrier elements and said individual coils have a hexagonal shape.

3. The mufti-channel coil array of claim 1, wherein said carrier elements and said individual coils have a pentagonal shape.

4. The mufti-channel coil array of claim 1, wherein said carrier elements and said individual coils have a triangular shape.

5. The mufti-channel coil array of claim 1, wherein said carrier elements and said individual coils have a square shape.

6. The mufti-channel coil array of claim 1, wherein individual coil elements of neighboring coils overlap one another.

7. The mufti-channel coil array of claim 1, wherein all individual coil elements of the mufti-channel coil array, carrier elements of which having a same outer contour, are identically constructed.

8. The mufti-channel coil array of claim 1, wherein said carrier elements and said individual coils are mechanically designed in such a fashion that said individual coils can be joined in a non-positive and positive fashion.

9. The mufti-channel coil array of claim 8 wherein said individual coils have holes for screws, cams or locating pins.

10. The mufti-channel coil array of claim 9, further comprising screws, cams or locating pins for joining together said individual coils.

11. The mufti-channel coil array of claim 10, wherein angles of said individual coils are fixed relative to one another by means of said locating pins, cams or screws.

12. The mufti-channel coil array of claim 1, wherein said carrier elements have openings through which additional capacitors and transformers can be connected to said individual coils.

13. The mufti-channel coil array of claim 1, wherein each individual coil element has a matching circuit for adjusting one or more resonance frequencies and/or performing an impedance transformation.

14. The mufti-channel coil array of claim 1, wherein at least one individual coil overlaps with all direct neighbors and further comprising additional loop-shaped structures which decouple individual coils which are not directly neighboring.

15. The method for producing the mufti-channel coil array of claim 1, the method comprising the step of numerically determining an optimum overlap between said individual coils as well as a shape of said loop-shaped structure, wherein a size of said loop-shaped structure thereby depends on an edge length of said individual coil.

16. The method of claim 15, wherein a virtual model having geometrical dimensions of an individual coil is generated for numerical optimization and several virtual individual coils are joined to form a minimum mufti-channel coil array.

* * * * *